(12) United States Patent
Alpay et al.

(10) Patent No.: US 8,481,887 B2
(45) Date of Patent: Jul. 9, 2013

(54) METHOD FOR MACHINING TAPERED MICRO HOLES

(75) Inventors: Mehmet E. Alpay, Portland, OR (US);
Jeffrey Howerton, Portland, OR (US);
Michael Nashner, Portland, OR (US);
Ling Wen, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1178 days.

(21) Appl. No.: 12/111,594

(22) Filed: Apr. 29, 2008

(65) Prior Publication Data

US 2008/0272095 A1 Nov. 6, 2008

Related U.S. Application Data

(60) Provisional application No. 60/915,770, filed on May 3, 2007.

(51) Int. Cl.
*B23K 26/08* (2006.01)
*B23K 26/38* (2006.01)
*H01L 21/52* (2006.01)

(52) U.S. Cl.
USPC ............... 219/121.71; 219/121.69; 438/637; 438/640; 361/748

(58) Field of Classification Search
USPC ............. 219/121.7, 121.71, 121.78–121.8, 219/121.85, 121.67–121.69, 121.73; 174/255, 174/262; 361/748–804
See application file for complete search history.

(56) References Cited

U.S. PATENT DOCUMENTS

| 4,992,025 | A | * | 2/1991 | Stroud et al. ................ 416/97 R |
| 5,043,553 | A | * | 8/1991 | Corfe et al. ................ 219/121.7 |
| 5,593,606 | A | | 1/1997 | Owen et al. |
| 5,731,047 | A | * | 3/1998 | Noddin ........................ 427/555 |
| 6,355,907 | B1 | * | 3/2002 | Kuehnle et al. ............ 219/121.7 |
| 6,610,960 | B2 | | 8/2003 | De Steur et al. |
| 6,627,844 | B2 | | 9/2003 | Liu et al. |
| 6,897,405 | B2 | * | 5/2005 | Cheng et al. ............. 219/121.71 |
| 7,019,257 | B2 | * | 3/2006 | Stevens .................... 219/121.71 |
| 8,410,396 | B1 | * | 4/2013 | Chang et al. ............. 219/121.7 |
| 2003/0180569 | A1 | * | 9/2003 | Hamann et al. ............. 428/596 |
| 2004/0164060 | A1 | * | 8/2004 | Maeda et al. ............ 219/121.71 |
| 2007/0278703 | A1 | | 12/2007 | Hardy et al. |
| 2007/0291496 | A1 | | 12/2007 | Nashner et al. |
| 2008/0024470 | A1 | | 1/2008 | Andre et al. |
| 2008/0084404 | A1 | | 4/2008 | Andre et al. |

FOREIGN PATENT DOCUMENTS

DE  3230131 A  *  2/1984

* cited by examiner

*Primary Examiner* — Samuel M Heinrich
(74) *Attorney, Agent, or Firm* — Young Basile

(57) ABSTRACT

A method for laser machining through micro-holes having desired geometric cross-section requirements in a thin, substantially homogenous material.

18 Claims, 6 Drawing Sheets

US 8,481,887 B2

METHOD FOR MACHINING TAPERED MICRO HOLES

DESCRIPTION OF RELATED APPLICATION

This application claims priority of Provisional Patent Application Ser. No. 60/915,770 filed May 3, 2007, which is incorporated by reference herein in its entirety.

TECHNICAL FIELD

The invention generally relates to the machining or drilling of micro-holes in micro-thin materials.

BACKGROUND

In recent times, technological investment and advancement has been made in laser micro-machining systems to drill micro-holes (referred to as micro-vias) in thin layer materials to establish pathways between printed circuit board layers. In these processes, the hole drilling process is typically followed by a plating process of the micro-vias to establish electrical connection or conductivity between the layers. In this type of drilling, it is typical that the micro-via cross sectional geometry, i.e. the via top and bottom hole diameters and the steepness or taper of the via sidewall, were not specifically required or could vary so long as the electrical performance of the plated vias was not affected. For example, it is typical that the electrical performance of the plated vias are primarily determined by their top and bottom diameters and an important consideration was the roughness of the via wall as relatively large protrusions into the via cavity may interfere with the plating process. Respecting the via geometry, the typical specification requirements for such applications were simply biased toward steeper and smoother via walls.

BRIEF SUMMARY

As the above drilling and machining processes were not intended to and/or are not applicable or useful where the specific geometry of the tapered through hole is required, for example where specific entry and exit hole diameters are required or desired, there exists a need for the establishment of parameters for such machining of through holes and a particular process to drill such holes with required or specified geometries. The ability to drill micro through-holes with specified entry and exit opening sizes, which thereby establish the taper or angle of the sidewall, is particularly useful where the through holes are used for the transmission of light through the thin material. By drilling micro through-holes with controlled sizes of the entry and exit openings in light transmitting applications, the amount of light transmission as well as the divergent light characteristics of the output beam through the exit opening can be controlled and optimized for the particular commercial application. For example, where a micro through-hole sidewall is too steep (approaching a 90 degree angle from a surface on the exit opening side of the material up to the nearest sidewall), there is generally high light transmission through the hole, but relatively poor light divergence requiring a user to be looking directly at the exit hole to see the transmitted light. To the contrary, if the micro-through-hole sidewall is not steep enough (relatively substantially less than a 90 degree angle from a surface on the exit opening side of the material up to the nearest sidewall), this results in greatly decreased light transmissibility through the micro through-hole when the hole is illuminated from the side with the larger hole opening (typically, the entry side).

The inventive method for laser machining micro-holes having specific cross-sectional geometries through a material is disclosed. The inventive process is particularly useful, although not limited to, single-layer materials with substantially homogeneous composition. An exemplary application is where the thin material and micro holes are used for the transmission of light.

The method includes establishing the drilling parameters including laser power and laser pulse repetition frequency values that are required to remove material in the material to be machined. Other parameters include at least one tooling trajectory or path which the laser follows in removing material to form the micro-hole as well as the tooling speed rate at which the material is removed along the tooling trajectory.

In one example, the tooling trajectory includes a three-phase trajectory path including a first trajectory to define the first micro-hole opening, a second trajectory to define the tapered inner wall of the hole and a third trajectory to define a second hole opening opposite the first hole opening.

In another example, the first laser trajectory includes at least one concentric revolution about a longitudinal axis of the micro-hole. The second trajectory includes an open path of concentric revolutions of decreasing radial length about the longitudinal axis. The third trajectory includes at least one concentric revolution about the longitudinal axis.

Other applications of the present invention will become apparent to those skilled in the art when the following description is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Referring to FIGS. 1-6, a method for drilling or machining micro-holes all of the way through a thin substrate or material, referred to as a through hole, is disclosed. It has generally been determined through experimentation described below that several process parameters are useful and should be considered in drilling through micro-holes to obtain a required or specified hole geometry.

Figure 6:
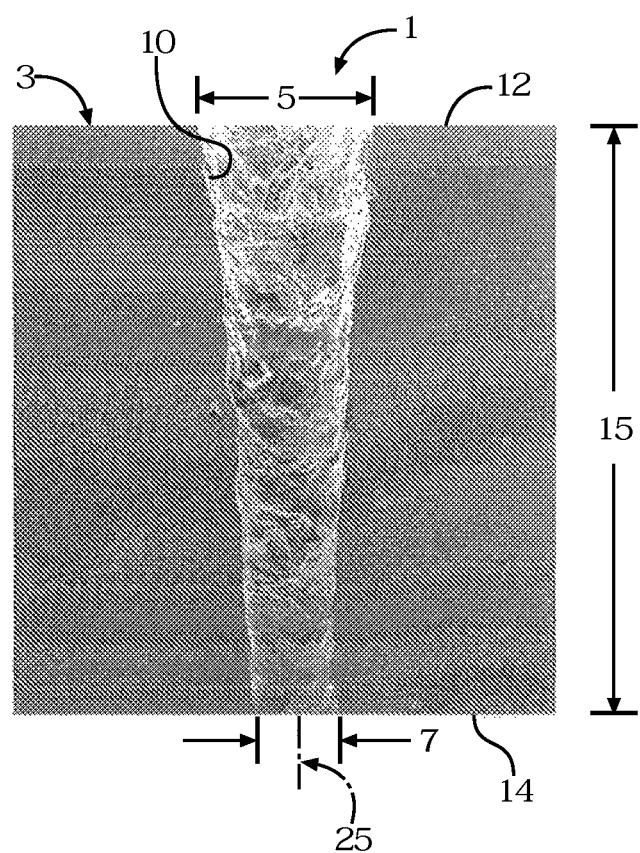
FIG. 6 is an exemplary SEM picture of a micro-hole resulting from the exemplary three phase tooling trajectory shown in FIGS. 1-5.

The first parameters to be considered deal with the particular laser used to drill the holes, here the power of the laser and the pulse repetition frequency of the laser used to drill or machine the micro-holes. As best seen in FIG. 6, to drill a through micro-hole 1 in an aluminum alloy material 3 having a thickness 15 of 400 micrometers (μm) having a 90 μm diameter entry opening 5 and a 30 μm diameter exit opening 7, a 532 nanometer (nm) DPSS Nd:YAG laser is suitable. The successful experiment in drilling the above-described hole 1 was carried out with 4.5 watt (W) of average laser power on the above-described material 3 work surface delivered at 10 Kilohertz (Khz). The above successful machining process was carried out at a laser focal plane with an optical topology that yielded a 28 μm focused Gaussian beam spot on the work surface 12. It is understood that other lasers, laser power and pulse repetition frequencies deviating from the above experiment, known by those skilled in the art, may be used without deviating from the present invention. It is further understood that different materials and thicknesses may be used.

The next parameter to be considered in the present machining method is the tooling trajectory or path that the laser will follow in drilling the micro-hole 1. As best seen in FIGS. 1-5, it has been determined through experimentation that a three-phase tooling trajectory 20 for drilling through micro-holes is particularly useful in drilling where specified or particular hole geometries are required. The preferred three-phase tooling trajectory includes a first trajectory (or phase 1) 30, a second trajectory (or phase 2) 40 and a third trajectory (or phase 3) 50.

Figure 1:
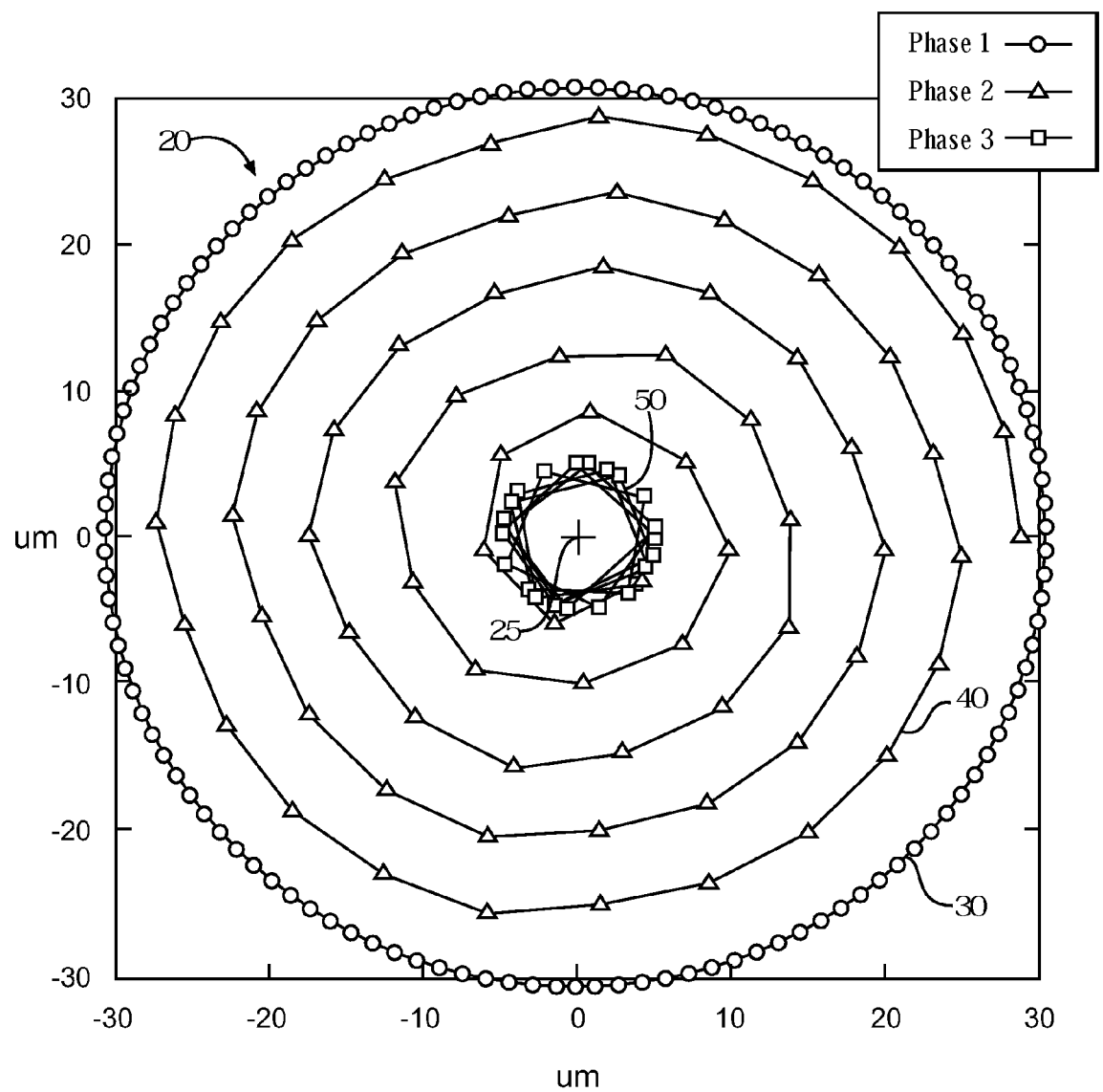
FIG. 1 is an example of a three-phase tooling trajectory to drill an exemplary micro-hole in a thin material.
Figure 2:
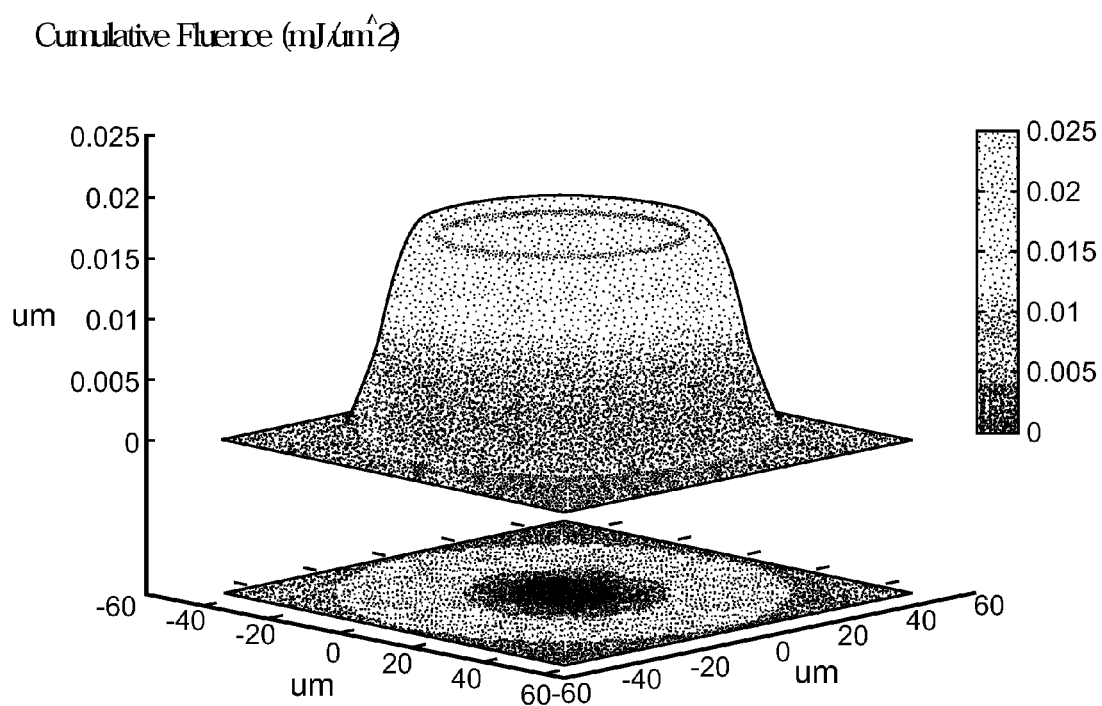
FIG. 2 is a graph showing cumulative fluence distribution as a function of position on a work surface resulting from the phase 1 trajectory in FIG. 1.
Figure 3:
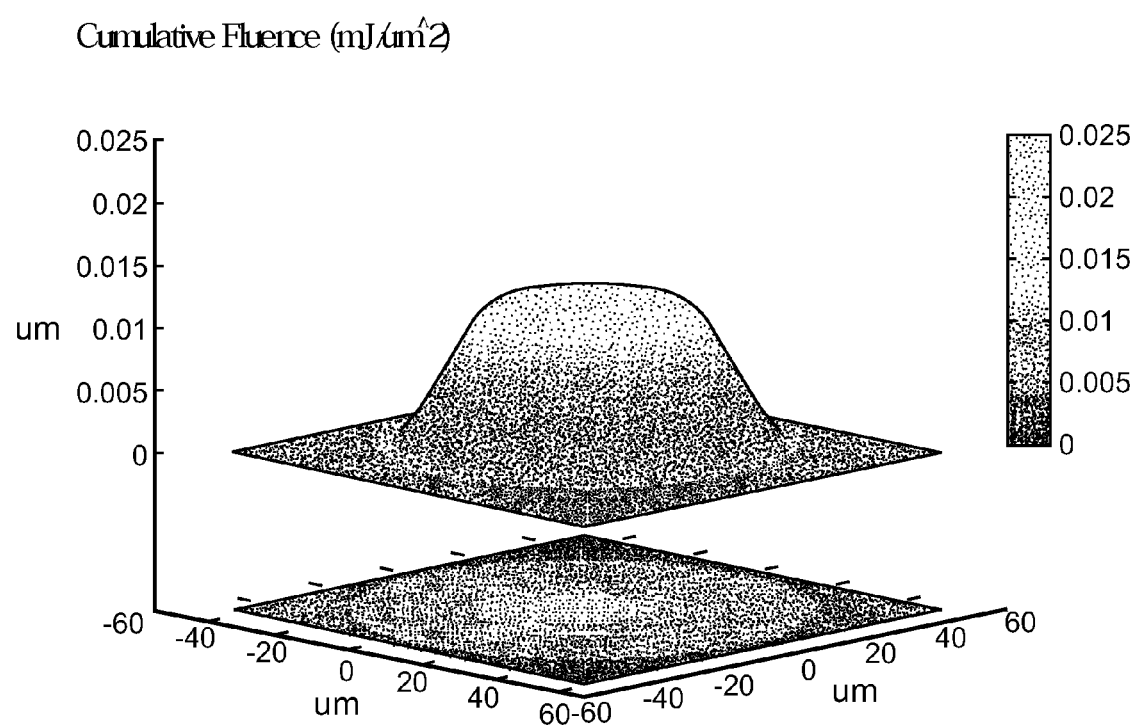
FIG. 3 is a graph illustrating cumulative fluence distribution as a function of position on a work surface resulting from the phase 2 trajectory in FIG. 1.
Figure 4:
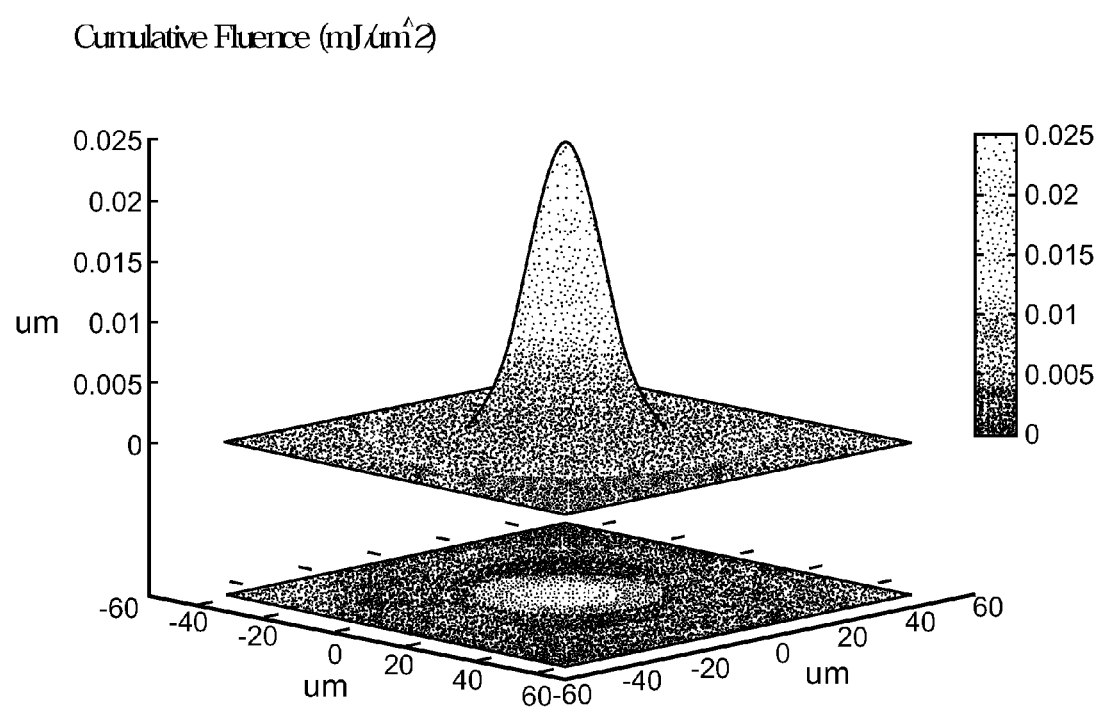
FIG. 4 is a graph showing the cumulative fluence distribution as a function of position on a work surface resulting from the phase 3 trajectory as shown in FIG. 1.
Figure 5:
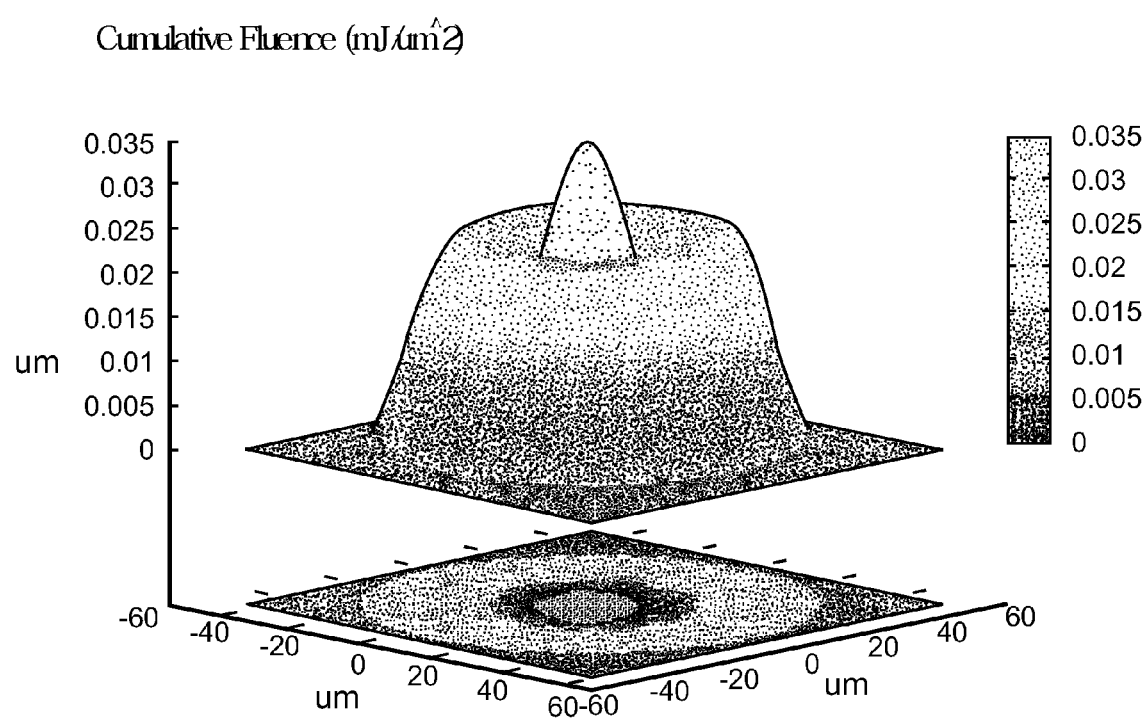
FIG. 5 is a compilation graph showing the cumulative fluence distributions as a function of position on a work surface resulting from the individual trajectories shown in FIGS. 2-4.

Referring to FIGS. 1, 2 and 6, a preferred first tooling trajectory 30 of the preferred three-phase tooling trajectory 20 is illustrated. It has been determined through experimentation that a first trajectory 30 across a first surface 12 of material 3 is useful to define the top (entry) diameter or first opening 5 of the micro-hole 1. In the preferred first tooling trajectory 30, a closed path circular-shaped trajectory is suitable to define the first opening 5 in the first material surface 12 as best seen in FIG. 6. As best seen in FIG. 1, a circular-shaped trajectory 30 consisting of at least one complete revolution around longitudinal axis 25 is used. In a preferred example, a plurality of complete circular revolutions 30 about longitudinal axis 25 was sufficient to establish the first opening 5 while also removing some bulk material 3.

Through experimentation, to drill a 90 μm diameter first opening 5 and a 30 μm diameter exit second opening 7 in 400 μm thick aluminum using a 28 μm focused Gaussian beam spot, the first trajectory 30 consisted of five circular revolutions around longitudinal axis 25 with a 60 μm diameter at a cutting speed of 73 millimeters per second (mm/sec).

In the second phase or trajectory 40 of the preferred three-phase tooling trajectory 20, an open path 40 consisting of concentric circles decreasing in radial distance or length from axis 25 beginning at a point along first trajectory 30 and ending at a point along third trajectory 50 was suitable to drill the required via 1 having inner wall 10.

Through experimentation, to drill the above-described hole geometry, second trajectory 40 included five open spiral revolutions about longitudinal axis 25. The revolutions were at a radial pitch or radial reduction of 10 millimeters per revolution (mm/rev) starting at the first trajectory 60 μm outer drilling diameter and ending at the 10 μm diameter (third trajectory 50) 7 at a cutting speed of 73 mm/sec.

In the preferred third tooling phase or trajectory 50, a closed trajectory path of at least one concentric revolution 50 about the longitudinal axis 25 is used. In a preferred example, numerous closed revolutions in a circular-shaped path about longitudinal axis 25 were used.

Through experimentation, to drill the above described hole 1, the third trajectory 50 included five complete circular-shaped revolutions about longitudinal axis 25 with a 10 μm diameter 7 at a cutting speed of 73 mm/sec.

Although the disclosed experiment for drilling the above-described hole 1 in material 3 using three separate trajectories in the specific manner described, it is understood that variation in the parameters and trajectories known by those skilled in the art may be used without deviating from the present invention.

It is further understood that although the preferred three-phase tooling trajectory 20 includes first 30, second 40 and third 50 trajectories disclosed as separate, interrupted trajectories, the first 30, second 40 and third 50 trajectories can be seamless or carried out in a continuous uninterrupted process. It is further understood that additional or a fewer amount of tooling phases or trajectories may be used depending on the material 3 and other parameters discussed herein as known by those skilled in the art. It is further understood that the experimental hole 1 described above with the particular geometry shown in FIG. 6 is exemplary only, and other size and shape holes with an associated first opening 5, second opening 7 and tapered inner wall 10 in material 3 may be made through the inventive process without deviating from the present invention.

The fourth process parameter to be considered is the tooling speed or rate at which the laser moves along material 3 to remove material 3. Through experimentation, it was determined that under the experimental parameters described above, 73 mm/sec. was a suitable tooling speed to produce a satisfactory via with the desired geometry. It is understood that other tooling speeds known by those skilled in the art may be used without deviating from the invention.

The above-described embodiments have been described in order to allow easy understanding of the invention and do not limit the invention. On the contrary, the invention is intended to cover various modifications and equivalent arrangements included within the scope of the appended claims, which scope is to be accorded the broadest interpretation so as to encompass all such modifications and equivalent structure as is permitted under the law.

What is claimed is:

1. A method for laser machining micro-holes having predetermined cross-sectional geometries about a longitudinal axis through a thin material, the method comprising:

establishing laser power and laser pulse repetition frequency values required to remove material in the thin material;

establishing a plurality of tooling trajectories defining a first hole opening in one surface of the thin material, a second hole opening in a surface opposite the first hole opening and a tapered inner wall extending from the first hole opening to the second hole opening of the required cross-sectional geometry of the micro-hole, the first hole opening larger than the second hole opening;

establishing a tooling speed rate at which the material is removed along the plurality of tooling trajectories; and traversing the plurality of tooling trajectories to form the micro-hole.

2. A method for laser machining micro-holes having predetermined cross-sectional geometries about a longitudinal axis through a thin material, the method comprising:

establishing laser power and laser pulse repetition frequency values required to remove material in the thin material;

establishing at least one tooling trajectory defining a first hole opening, a second hole opening opposite the first hole opening and a tapered inner wall extending from the first hole opening to the second hole opening of the required cross-sectional geometry of the micro-hole, the first hole opening larger than the second hole opening;

establishing a tooling speed rate at which the material is removed along the tooling trajectory; and traversing the at least one tooling trajectory to form the micro-hole; wherein the at least one tooling trajectory comprises:
   a first tooling trajectory to define the first hole opening;
   a second tooling trajectory to define the tapered inner wall extending from the first hole opening; and
   a third tooling trajectory to define the second hole opening opposite the first hole opening.

3. The method of claim 2 wherein the first trajectory is a closed path of at least one concentric revolution about the longitudinal axis.

4. The method of claim 3 wherein the closed path is circular shape.

5. The method of claim 2 wherein the second trajectory is an open path of concentric revolutions of decreasing radial length about the longitudinal axis.

6. The method of claim 5 wherein the path of concentric revolutions is circular spiral shaped.

7. The method of claim 2 wherein the third tooling trajectory is a closed path of at least one revolution at a radial length about the longitudinal axis.

8. The method of claim 7 wherein the closed path is circularly shaped.

9. The method of claim 2 wherein the first, second, and third tooling trajectories comprise one continuous path.

10. The method of claim 1 wherein the thin material is a single layer of substantially homogeneous material.

11. The method of claim 1, further comprising:
traversing a first trajectory concentric about the longitudinal axis defining the first hole opening in the material;
traversing a second trajectory radially inward of the first trajectory about the longitudinal axis defining the geometry of the tapered inner wall extending from the first hole opening and into the thin material; and
traversing a third trajectory radially inward of the second trajectory about the longitudinal axis defining the second hole.

12. The method of claim 11 wherein the first trajectory comprises a plurality of closed-end, circular-shaped revolutions about the longitudinal axis having substantially a same radial distance from the longitudinal axis.

13. The method of claim 11 wherein the second trajectory comprises an open spiral-path of concentric revolutions of decreasing radial length about the longitudinal axis.

14. The method of claim 11 wherein the third trajectory comprises a plurality of closed-end circular-shaped revolutions about the longitudinal axis having substantially a same radial distance from the longitudinal axis.

15. The method of claim 1, further comprising:
determining a thickness of the thin material to be machined; and
determining a size of the first hole opening and the second hole opening of the micro-hole defining the tapered inner wall of the micro-hole.

16. The method of claim 15 wherein traversing the plurality of tooling trajectories comprises:
traversing a first tooling trajectory about the longitudinal axis;
traversing a second tooling trajectory about the longitudinal axis; and
traversing a third tooling trajectory about the longitudinal axis.

17. The method of claim 16 wherein the first and third trajectories are closed-end circular trajectories and the second trajectory is an open spiral circular trajectory.

18. The method of claim 16 wherein determining the size of the first hole and second hole openings comprises:
determining a desired transmissivity of light through the thin material and a divergence of light through the exit opening.

* * * * *